United States Patent
Asano

(10) Patent No.: US 9,847,472 B2
(45) Date of Patent: Dec. 19, 2017

(54) PIEZOELECTRIC TRANSFORMER

(71) Applicant: Murata Manufacturing Co., Ltd., Nagaokakyo-shi, Kyoto-fu (JP)

(72) Inventor: Hiroshi Asano, Nagaokakyo (JP)

(73) Assignee: MURATA MANUFACTURING CO., LTD., Nagakakyo-shi, Kyoto-fu (JP)

( * ) Notice: Subject to any disclaimer, the term of this patent is extended or adjusted under 35 U.S.C. 154(b) by 418 days.

(21) Appl. No.: 14/638,168

(22) Filed: Mar. 4, 2015

(65) Prior Publication Data

US 2015/0179921 A1 Jun. 25, 2015

Related U.S. Application Data

(63) Continuation of application No. PCT/JP2013/069151, filed on Jul. 12, 2013.

(30) Foreign Application Priority Data

Nov. 13, 2012 (JP) ................................. 2012-248894

(51) Int. Cl.
*H01L 41/107* (2006.01)
*H01L 41/047* (2006.01)

(52) U.S. Cl.
CPC ........ *H01L 41/107* (2013.01); *H01L 41/0472* (2013.01)

(58) Field of Classification Search
CPC ... H01L 4/107; H01L 41/0472; H01L 41/253; H01L 41/257
USPC ................................................. 310/359, 357
See application file for complete search history.

(56) References Cited

U.S. PATENT DOCUMENTS

| 5,365,141 A | 11/1994 | Kawai et al. | |
| 5,463,266 A * | 10/1995 | Fukuoka | H01L 41/107 310/359 |
| 5,757,106 A * | 5/1998 | Sato | H01L 41/107 310/359 |
| 5,811,913 A * | 9/1998 | Kawai | H01L 41/107 310/359 |
| 5,912,601 A * | 6/1999 | Unami | H03H 9/1014 310/321 |

(Continued)

FOREIGN PATENT DOCUMENTS

| JP | 7-193293 A | 7/1995 |
| JP | 2998717 B2 | 1/2000 |

(Continued)

OTHER PUBLICATIONS

International Search Report for PCT/JP2013/069151, dated Aug. 20, 2013.

*Primary Examiner* — Bryan Gordon
(74) *Attorney, Agent, or Firm* — Arent Fox LLP

(57) ABSTRACT

A piezoelectric transformer that includes a piezoelectric body having driving portions and a power generating portion, an input electrode, and an output electrode. The driving portions and the power generating portion are arranged in the lengthwise direction of the piezoelectric body. The driving portions are disposed symmetrically relative to a plane that passes through a center of the piezoelectric body in the lengthwise direction and is orthogonal to the lengthwise direction, occupy no less than half of the regions in the piezoelectric body, and are include two or more adjacent polarized regions.

17 Claims, 7 Drawing Sheets

(56) References Cited

U.S. PATENT DOCUMENTS

| | | | |
|---|---|---|---|
| 6,366,006 B1* | 4/2002 | Boyd | H01L 41/107 310/359 |
| 2003/0137222 A1* | 7/2003 | Takeda | H01L 41/107 310/359 |
| 2006/0113877 A1* | 6/2006 | Chen | H01L 41/107 310/359 |
| 2009/0236948 A1* | 9/2009 | Hoffmann | H01L 41/107 310/366 |

FOREIGN PATENT DOCUMENTS

| | | |
|---|---|---|
| JP | 2004-146653 A | 5/2004 |
| JP | 4297388 B2 | 7/2009 |
| JP | 2012-9708 A | 1/2012 |

* cited by examiner

PIEZOELECTRIC TRANSFORMER

CROSS REFERENCE TO RELATED APPLICATIONS

The present application is a continuation of International application No. PCT/JP2013/069151, filed Jul. 12, 2013, which claims priority to Japanese Patent Application No. 2012-248894, filed Nov. 13, 2012, the entire contents of each of which are incorporated herein by reference.

FIELD OF THE INVENTION

The present invention relates to piezoelectric transformers, and particularly relates to piezoelectric transformers used in contactless power transmission.

BACKGROUND OF THE INVENTION

Contactless power transmission is recently being used as a method for charging secondary batteries in cellular phones, digital cameras, and the like. Electric field coupling, in which power is transmitted through capacitive coupling between opposing electrodes, is one technique used for contactless power transmission. In contactless power transmission that uses electric field coupling, high voltages and high frequencies are important for increasing the efficiency of power transmission. As such, in order to employ electric field coupling contactless power transmission for electronic devices such as cellular phones, it is necessary to provide, in an electronic device serving as a receiving side, a transformer that transforms high-voltage power supplied from a sending side through contactless power transmission into low-voltage power suited to the circuitry of the electronic device.

A piezoelectric transformer is an example of a transformer that can be used as a transformer for contactless power transmission. The piezoelectric transformers disclosed in Patent Document 1 and Patent Document 2 are known as examples of conventional piezoelectric transformers. However, the piezoelectric transformers disclosed in Patent Document 1 and Patent Document 2 are piezoelectric transformers for cold-cathode tubes used in liquid crystal display backlights. A cold-cathode tube piezoelectric transformer handles lower frequencies than the frequencies demanded from transformers used for contactless power transmission. Accordingly, the piezoelectric transformers disclosed in Patent Document 1 and Patent Document 2 cannot be used as-is as transformers for contactless power transmission. Specifically, there are two ways in which the piezoelectric transformers disclosed in Patent Document 1 and Patent Document 2 can be altered to handle the high frequencies demanded from transformers for contactless power transmission. One is by further reducing the size of the piezoelectric transformer, and the other is by changing the vibration mode to a higher-order vibration mode. With the former, further reducing the size of the piezoelectric transformers disclosed in Patent Document 1 and Patent Document 2 reduces the efficiency of power transmission. Accordingly, it is necessary to change the vibration mode to a higher-order vibration mode in order to handle the high frequencies demanded from transformers for contactless power transmission without a drop in the efficiency of power transmission. A coil transformer is another example, aside from a piezoelectric transformer, of a transformer that can be used as a transformer for contactless power transmission. While coil transformers are currently the mainstream in terms of transformers for contactless power transmission, they are also larger than piezoelectric transformers. Coil transformers furthermore carry a risk of increased electrical resistance as the frequency of supplied power rises.

For such reasons, a piezoelectric transformer that employs a high-order vibration mode is in demand as a transformer for contactless power transmission. A piezoelectric transformer that employs primary to tertiary vibration modes will be given here as an example in order to describe a problem with piezoelectric transformers that employ high-order vibration modes.

A piezoelectric transformer 500 illustrated in FIG. 12 is a piezoelectric transformer that uses a primary (base) vibration mode or a secondary vibration mode. A piezoelectric transformer 600 illustrated in FIG. 13 is a piezoelectric transformer that uses a tertiary vibration mode. FIG. 12 is a diagram illustrating a side surface of the piezoelectric transformer 500 along with stress and displacement in respective areas of the piezoelectric transformer 500. FIG. 13 is a diagram illustrating a side surface of the piezoelectric transformer 600 along with stress and displacement in respective areas of the piezoelectric transformer 600. The arrows in FIG. 12 and FIG. 13 indicate polarization directions. A graph in (a) of FIG. 12 represents stress W1$a$ and displacement W1$b$ in the respective areas in the primary vibration mode, and a graph in (b) of FIG. 12 represents a waveform W2$a$ indicating stress and W2$b$ indicating displacement in the respective areas during the secondary vibration mode. A graph in FIG. 13 represents stress W3$a$ and displacement W3$b$ in the respective areas during the tertiary vibration mode.

As shown in FIG. 12, the piezoelectric transformer 500 includes a long, plate-shaped piezoelectric body 501 configured of piezoelectric ceramics, an input electrode 520, and an output electrode 530. The input electrode 520 is provided on two main surfaces of one side of the piezoelectric body 501. The output electrode 530 is provided on an end surface of the other side of the piezoelectric body 501. As shown in FIG. 12, the one side of the piezoelectric body 501 is polarized along a thickness direction of the piezoelectric body 501, and the other side of the piezoelectric body 501 is polarized along a lengthwise direction of the piezoelectric body 501.

According to the piezoelectric transformer 500, when a voltage at a specific frequency is applied to the input electrode 520, a strong mechanical vibration is produced in the piezoelectric body 501 due to an inverse piezoelectric effect. A standing wave having a half-wave length is produced in the piezoelectric body 501 at this time. Furthermore, the piezoelectric transformer 500 outputs a voltage corresponding to the mechanical vibrations from the output electrode 530 as a result of a piezoelectric effect.

As shown in FIG. 13, the piezoelectric transformer 600 includes a long, plate-shaped piezoelectric body 601 configured of piezoelectric ceramics, input electrodes 620, and output electrodes 630. The input electrodes 620 are provided in a central area of two main surfaces of the piezoelectric body 601. The output electrodes 630 are provided on both end surfaces of the piezoelectric body 601 in the lengthwise direction thereof. The central area of the piezoelectric body 601 is polarized along a thickness direction of the piezoelectric body 601, and both end portions of the piezoelectric body 601 are polarized along the lengthwise direction of the piezoelectric body 601.

According to the piezoelectric transformer 600, when a voltage at a specific frequency is applied to the input electrode 620, a strong mechanical vibration is produced in the piezoelectric body 601 due to an inverse piezoelectric effect. A standing wave having a 1.5 wavelength is produced in the piezoelectric body 601 at this time. Furthermore, the piezoelectric transformer 600 outputs a voltage corresponding to the mechanical vibrations from the output electrode 630 as a result of a piezoelectric effect.

The respective waveforms shown in FIG. 12 and FIG. 13 will be compared next. Specifically, the waveforms W1b, W2b, and W3b in the respective vibration modes will be compared, by comparing the positions of the apexes of the antinodes where the phase of the displacement waveform reaches 180°, using a point at a left end portion where the displacement is equal as a base point (phase=0°). A distance between the position of the apex of the antinode in the secondary vibration mode and the position of the apex of the antinode in the tertiary vibration mode is shorter than a distance between the position of the apex of the antinode in the primary vibration mode and the position of the apex of the antinode in the secondary vibration mode. This indicates that the wavelength becomes shorter in higher-order vibration modes, and the apexes of the antinodes near the base point become closer in the displacement waveforms in the respective vibration modes. In other words, with a piezoelectric transformer that uses high-order vibration modes, a plurality of vibration modes having similar waveforms will be present together. As such, if an attempt is made to excite a desired vibration mode in a piezoelectric transformer that uses high-order vibration modes, it is possible that a different vibration mode having a waveform similar to the waveform of the desired vibration mode will be excited instead. In other words, piezoelectric transformers that use high-order vibration modes have a problem in that unnecessary vibration modes occur with greater ease than in piezoelectric transformers that use low-order vibration modes.

Patent Document 1: Japanese Patent No. 2998717
Patent Document 2: Japanese Patent No. 4297388

SUMMARY OF THE INVENTION

Accordingly, it is an object of the present invention to provide a piezoelectric transformer capable of suppressing the occurrence of an unnecessary vibration mode.

A piezoelectric transformer according to the present invention is a piezoelectric transformer that uses a seventh-order or greater vibration mode, and includes a piezoelectric body, having a plurality of polarized regions, that has a plurality of driving portions configured by a first polarized region of the plurality of polarized regions and a power generating portion configured by a second polarized region of the plurality of polarized regions; an input electrode that applies a voltage to each of the plurality of driving portions; and an output electrode that outputs a voltage generated by the power generating portion. Here, the plurality of driving portions and the power generating portion are arranged in a lengthwise direction of the piezoelectric body; the plurality of driving portions are disposed symmetrically relative to a plane that passes through a center of the piezoelectric body in the lengthwise direction and is orthogonal to the lengthwise direction, and occupy half or more of the regions in the piezoelectric body; and each of the plurality of driving portions is configured by two or more adjacent polarized regions.

The piezoelectric transformer according to the present invention can suppress an unnecessary vibration mode from being produced.

DETAILED DESCRIPTION OF THE PREFERRED EMBODIMENTS

A piezoelectric transformer and a manufacturing method thereof according to an embodiment of the present invention will be described hereinafter.

(Configuration of Piezoelectric Transformer)

Figure 1:
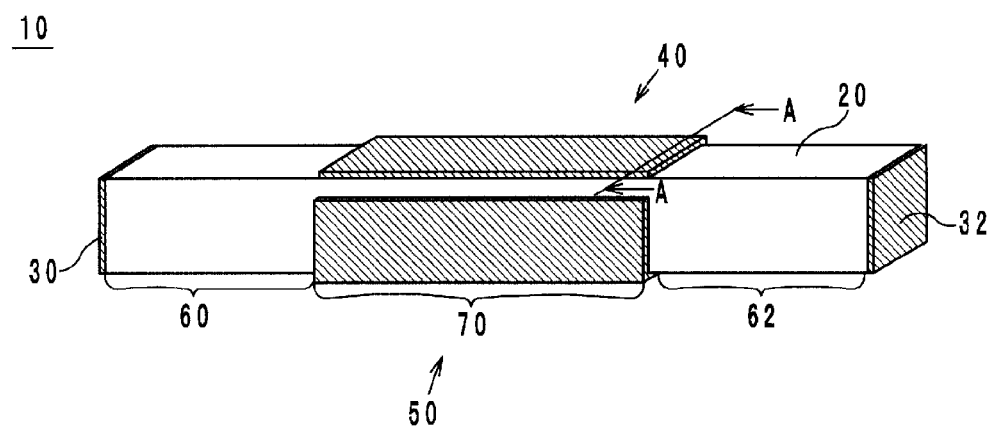
FIG. 1 is an external perspective view of a piezoelectric transformer according to an embodiment of the present invention.
Figure 2:
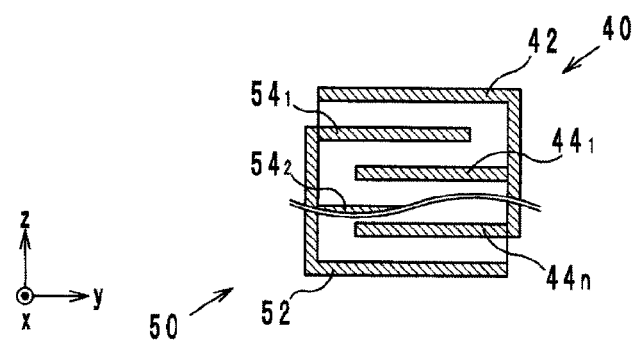
FIG. 2 is a cross-sectional view from an A-A cross-section in FIG. 1.
Figure 3:
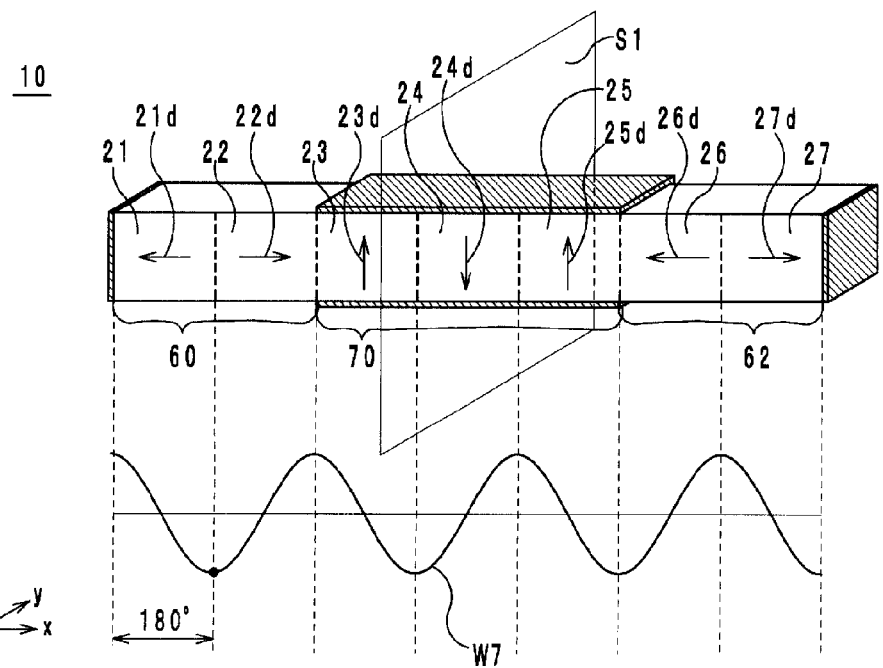
FIG. 3 is a diagram illustrating a polarization direction and displacement at respective areas of a piezoelectric transformer according to an embodiment of the present invention.

Hereinafter, the configuration of the piezoelectric transformer according to this embodiment of the present invention will be described with reference to the drawings. FIG. 1 is an external perspective view of a piezoelectric transformer 10 according to this embodiment of the present invention. FIG. 2 is a cross-sectional view from an A-A cross-section in FIG. 1. FIG. 3 is a diagram illustrating a polarization direction and displacement at respective areas of the piezoelectric transformer 10 according to this embodiment of the present invention. The arrows in FIG. 3 indicate the polarization directions. A lengthwise direction of the piezoelectric transformer 10 will be defined as an x-axis direction, and directions orthogonal thereto will be defined as a y-axis direction and a z-axis direction. Note that the x axis, the y axis, and the z axis are orthogonal to one another.

As shown in FIG. 1, the piezoelectric transformer 10 has a parallelepiped shape. The piezoelectric transformer 10 is a step-down piezoelectric transformer that includes a piezoelectric body 20, input electrodes 30 and 32, an output electrode 40, and a ground electrode 50.

As shown in FIG. 1, the piezoelectric body 20 has a parallelepiped shape. The piezoelectric body 20 has a square cross-sectional shape when viewed as a cross-section parallel to a plane containing the y axis and the z axis. Furthermore, the piezoelectric body 20 is divided along the x-axis direction into seven equal polarized regions, as shown in FIG. 3. The polarized regions of the piezoelectric body 20 are indicated as polarized regions 21-27, and the polarized regions are arranged in that order from a negative x-axis direction side toward a positive x-axis direction side. Although the piezoelectric body 20 is configured of PZT-based piezoelectric ceramics in the present embodiment, it should be noted that the piezoelectric body 20 may be configured of lead titanate, for example.

The polarized regions 21 and 22 are polarized in a direction parallel to the x-axis direction, as indicated by the arrows in FIG. 3. A polarization direction 21d of the polarized region 21 and a polarization direction 22d of the polarized region 22, which are adjacent to each other, are opposite from each other. Specifically, the polarization direction 21d faces the negative x-axis direction side, and the polarization direction 22d faces the positive x-axis direction side. The polarized regions 21 and 22 configure a first polarized region.

The polarized regions 23-25 are polarized in a direction parallel to the z-axis direction, as indicated by the arrows in FIG. 3. A polarization direction 23d of the polarized region 23 and a polarization direction 24d of the polarized region 24, which are adjacent to each other, are opposite from each other. Furthermore, the polarization direction 24d of the polarized region 24 and a polarization direction 25d of the polarized region 25, which are adjacent to each other, are opposite from each other. Specifically, the polarization directions 23d and 25d face a positive z-axis direction side, and the polarization direction 24d faces a negative z-axis direction side. The polarized regions 23-25 configure a second polarized region.

The polarized regions 26 and 27 are polarized in a direction parallel to the x-axis direction, as indicated by the arrows in FIG. 3. A polarization direction 26d of the polarized region 26 and a polarization direction 27d of the polarized region 27, which are adjacent to each other, are opposite from each other. Specifically, the polarization direction 26d faces the negative x-axis direction side, and the polarization direction 27d faces the positive x-axis direction side. The polarized regions 26 and 27 configure the first polarized region. Note that the polarized regions 21-27, in which the polarization directions of mutually-adjacent polarized regions are opposite from each other, are formed by carrying out a poling treatment upon having formed polarization electrodes (not shown) between the mutually-adjacent polarized regions.

As shown in FIG. 1, the input electrodes 30 and 32 are electrodes that are provided at both end portions of the piezoelectric body 20 in the x-axis direction, and are configured of a metal such as Au, Ag, Pd, Cu, an alloy containing those metals, or the like. Specifically, the input electrode 30 is provided so as to cover an end portion of the piezoelectric body 20 on the negative x-axis direction side thereof. Meanwhile, the input electrode 32 is provided so as to cover an end portion of the piezoelectric body 20 on the positive x-axis direction side thereof. Accordingly, the input electrodes 30 and 32 have rectangular shapes when viewed from the x-axis direction. Note that the input electrodes 30 and 32 are electrically connected to an AC power source.

The output electrode 40 includes an output outer electrode 42 and output inner electrodes 441-44n. As shown in FIG. 2, the output outer electrode 42 is provided so as to cover respective surfaces of the polarized regions 23-25 on a positive y-axis direction side and the positive z-axis direction side thereof.

Meanwhile, each of the output inner electrodes 441-44n is provided so as to span across the polarized regions 23-25 within the piezoelectric body 20. Furthermore, the output inner electrodes 441-44n are rectangular plates that are orthogonal to the z-axis direction, and as shown in FIG. 2, are provided in multiple in that order from the positive z-axis direction side toward the negative z-axis direction side. Each of the output inner electrodes 441-44n is electrically connected to the output outer electrode 42. Note that the output electrode 40 is configured of a metal such as Au, Ag, Pd, Cu, an alloy containing those metals, or the like.

The ground electrode 50 includes a ground outer electrode 52 and ground inner electrodes 541-54n. As shown in FIG. 2, the ground outer electrode 52 is provided so as to cover respective surfaces of the polarized regions 23-25 on a negative y-axis direction side and the negative z-axis direction side thereof.

Meanwhile, each of the ground inner electrodes 541-54n is provided so as to span across the polarized regions 23-25 within the piezoelectric body 20. Furthermore, the ground inner electrodes 541-54n are rectangular plates that are orthogonal to the z-axis direction, and as shown in FIG. 2, are provided in multiple in that order from the positive side of the z-axis direction toward the negative side of the z-axis direction. Each of the ground inner electrodes 541-54n is electrically connected to the ground outer electrode 52. Note that the ground electrode 50 is configured of a metal such as Au, Ag, Pd, Cu, an alloy containing those metals, or the like.

According to the piezoelectric transformer 10 configured as described thus far, when a voltage at a frequency corresponding to a seventh-order vibration mode is applied to a segment sandwiched between the input electrode 30 and the ground electrode 50, or in other words, to the polarized regions 21 and 22, lengthwise vibrations parallel to the x-axis direction are produced in the piezoelectric body 20 due to an inverse piezoelectric effect. In other words, the polarized regions 21 and 22 serve as a driving portion in the piezoelectric transformer 10. Here, the driving portion configured by the polarized regions 21 and 22 will be referred to as a driving portion 60.

Furthermore, according to the piezoelectric transformer 10, when a voltage at a frequency corresponding to the seventh-order vibration mode is applied to the polarized regions 21 and 22, a voltage at a frequency corresponding to the seventh-order vibration mode is also applied to a segment sandwiched between the input electrode 32 and the ground electrode 50, or in other words, to the polarized regions 26 and 27, at the same time, which produces lengthwise vibrations parallel to the x-axis direction in the piezoelectric body 20. In other words, the polarized regions 26 and 27 also serve as a driving portion in the piezoelectric transformer 10. Here, the driving portion configured by the polarized regions 26 and 27 will be referred to as a driving portion 62.

As described above, the piezoelectric body 20 includes the two driving portions 60 and 62. Furthermore, as shown in FIG. 3, the driving portions 60 and 62 are disposed symmetrically relative to a plane S1 that passes through the center of the piezoelectric body 20 in the x-axis direction and is orthogonal to the x axis. Meanwhile, the driving portions 60 and 62 include the four polarized regions 21, 22, 26, and 27, which correspond to no less than half of the seven polarized regions into which the piezoelectric body 20 is divided equally. Furthermore, the driving portion 60 is configured of the two adjacent polarized regions 21 and 22, whereas the driving portion 62 is configured of the two adjacent polarized regions 26 and 27.

According to the piezoelectric transformer 10, the aforementioned vibrations in the piezoelectric body 20 are converted into electrical energy in the polarized regions 23-25 due to a piezoelectric effect. This electrical energy is obtained from the output electrode 40 and is supplied to electronic components electrically connected to the output electrode 40. Here, a power generating portion configured by the polarized regions 23-25 will be referred to as a power generating portion 70.

Note that in the piezoelectric transformer 10, a surface area over which the input electrodes 30 and 32 and the ground electrode 50 oppose each other is smaller than a surface area over which the output electrode 40 and the ground electrode 50 oppose each other. Furthermore, a distance between the respective input electrodes 30 and 32 and the ground electrode 50 is greater than a distance between the output electrode 40 and the ground electrode 50. Accordingly, an electrostatic capacity between the input electrode 30 and the ground electrode 50 and an electrostatic capacity between the input electrode 32 and the ground electrode 50 are sufficiently lower than an electrostatic capacity between the output electrode 40 and the ground electrode 50. Accordingly, the piezoelectric transformer 10 is used as a step-down piezoelectric transformer.

(Method for Manufacturing Piezoelectric Transformer)

First, a slurry having PZT-based piezoelectric ceramic particles as its primary component is molded using a doctor blade in order to obtain a green sheet.

Next, an electrode pattern that will serve as the output inner electrodes 441-44$n$ and the ground inner electrodes 541-54$n$ is formed on a surface of the green sheet using a method such as screen printing. A plurality of the green sheets on which the electrode pattern has been formed are then layered together and sintered. A laminated piezoelectric ceramic sintered body to serve as the piezoelectric body 20 is then obtained by cutting the sintered green sheet.

Then, a paste configured of Au, Ag, Pd, Cu, or the like is applied to both end surfaces in the lengthwise direction of the laminated piezoelectric ceramic sintered body obtained in this manner and allowed to dry, forming the input electrodes 30 and 32. Furthermore, a paste configured of a metal such as Au, Ag, Pd, Cu, an alloy containing those metals, or the like is applied to a central area of the multilayer body, or in other words, to a surface of a region where the polarized regions 23-25 are to be, and the paste is then allowed to dry, forming the output outer electrode 42 and the ground outer electrode 52. The output outer electrode 42 and the output inner electrodes 441-44$n$ are connected and the ground outer electrode 52 and the ground inner electrodes 541-54$n$ are connected at this time.

Finally, the polarized regions 21-27 are formed by carrying out a poling treatment; the piezoelectric body 20 is obtained and the piezoelectric transformer 10 is completed as a result.

Effects

Figure 4:
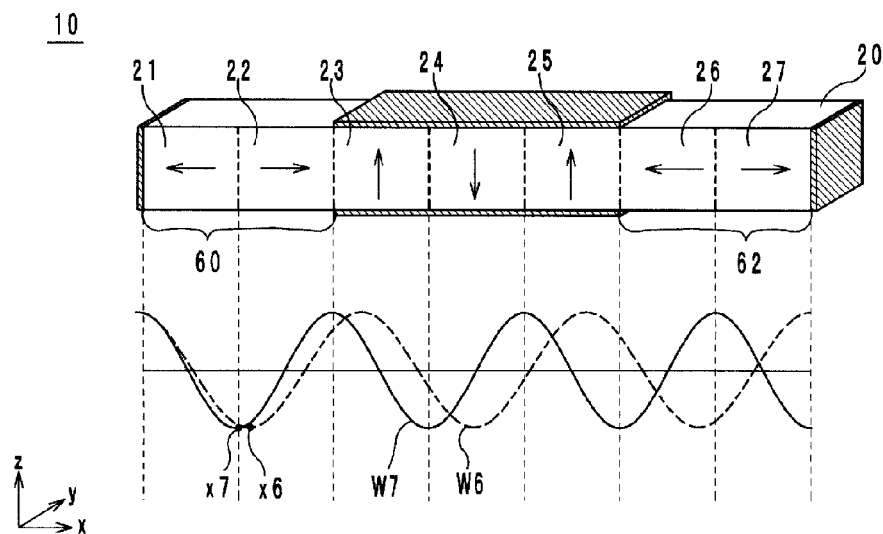
FIG. 4 is a diagram illustrating displacement at respective areas in a sixth-order vibration mode and a seventh-order vibration mode.
Figure 5:
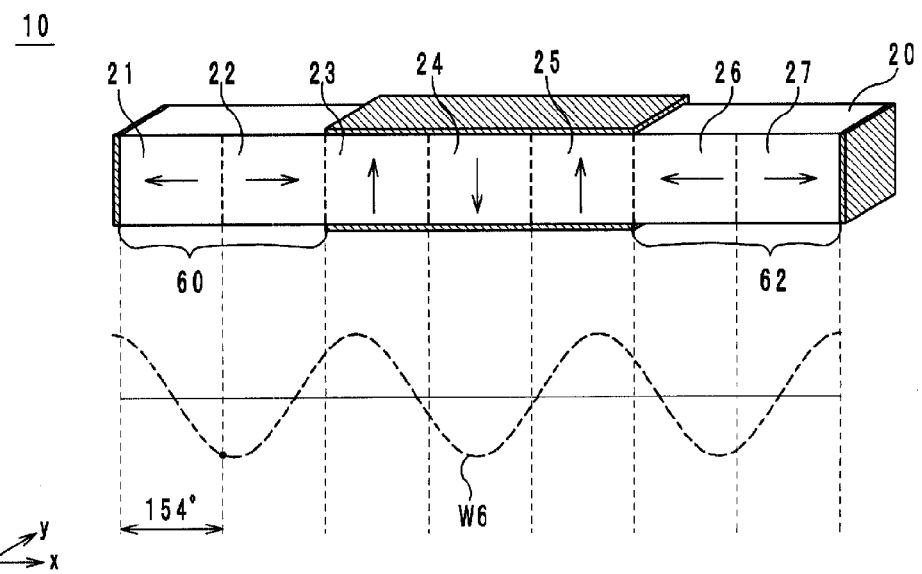
FIG. 5 is a diagram illustrating displacement at respective areas in a sixth-order vibration mode.
Figure 6:
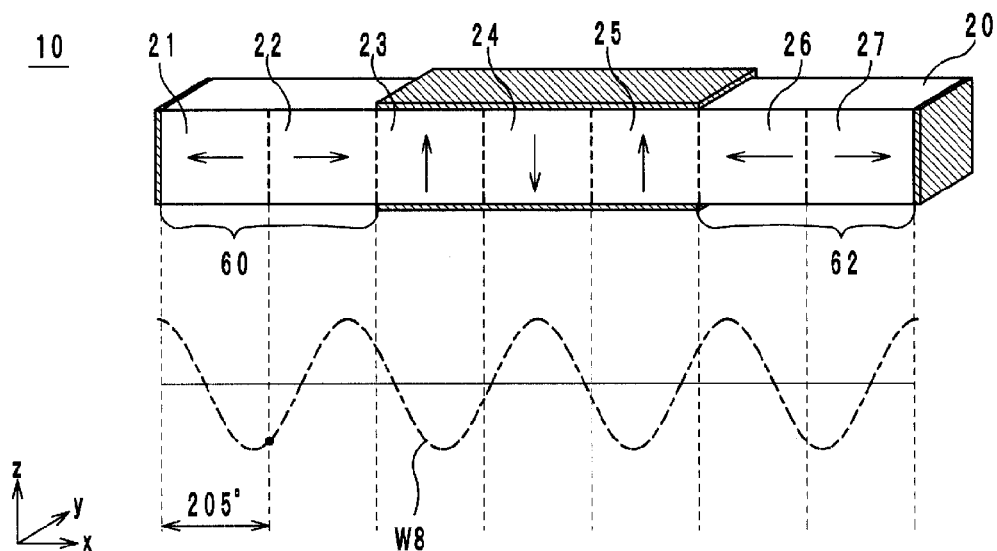
FIG. 6 is a diagram illustrating displacement at respective areas in an eighth-order vibration mode.
Figure 7:
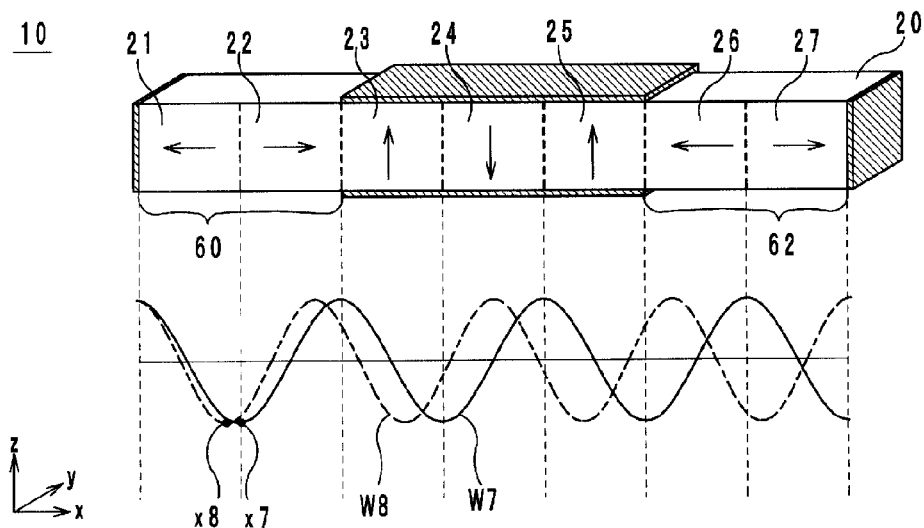
FIG. 7 is a diagram illustrating displacement at respective areas in a seventh-order vibration mode and an eighth-order vibration mode.
Figure 8:
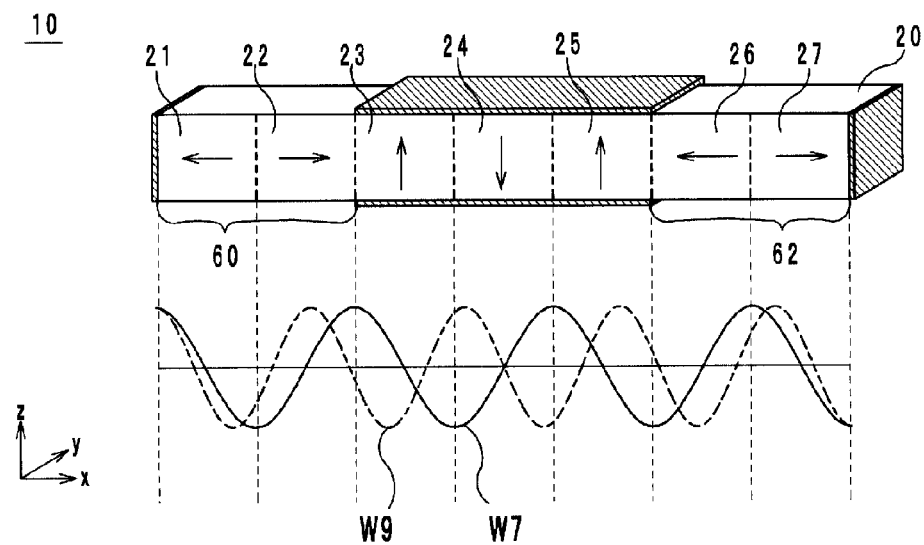
FIG. 8 is a diagram illustrating displacement at respective areas in a seventh-order vibration mode and a ninth-order vibration mode.

According to the piezoelectric transformer 10 configured as described thus far, the occurrence of unnecessary vibration modes can be suppressed for the reasons described hereinafter. FIG. 4 is a diagram illustrating displacement at respective areas in a sixth-order vibration mode and the seventh-order vibration mode. FIG. 5 is a diagram illustrating displacement at respective areas in the sixth-order vibration mode. FIG. 6 is a diagram illustrating displacement at respective areas in an eighth-order vibration mode. FIG. 7 is a diagram illustrating displacement at respective areas in the seventh-order vibration mode and the eighth-order vibration mode. FIG. 8 is a diagram illustrating displacement at respective areas in the seventh-order vibration mode and a ninth-order vibration mode. Here, the waveforms of the displacement of the respective areas in the sixth-order to ninth-order vibration modes are indicated by waveforms W6, W7, W8, and W9, respectively. Apexes of antinodes in the waveforms W6, W7, and W8 where the phase reaches 180° are indicated by apexes x6, x7, and x8, using a point where the displacement in each waveform is equal as a base point (phase=0°).

As shown in FIG. 4, according to the piezoelectric transformer 10, the apex x7 and the apex x6 are close to each other near a border between the polarized region 21 and the polarized region 22. In other words, vibration modes having similar waveforms are present together in the driving portion 60. However, according to the piezoelectric transformer 10, the phase of the waveform W7 advances by 180° from segment to segment in the polarized regions, as shown in FIG. 3. Meanwhile, the phase of the waveform W6 advances by about 154° from segment to segment in the polarized regions, as shown in FIG. 5. As a result, according to the piezoelectric transformer 10, a phase difference between the waveform W7 and the waveform W6 increases as the polarized regions progress from the base point, as indicated in FIG. 4. Ultimately, the waveforms W6 and W7 have mutually opposite phases at an end portion of the piezoelectric body 20 on the positive x-axis direction side thereof. Thus in the piezoelectric transformer 10, the waveforms W6 and W7 that are similar at the driving portion 60 are not similar at the driving portion 62, as shown in FIG. 4. Accordingly, the waveform W7 is produced at the driving portion 62 by applying an AC voltage corresponding to the seventh-order vibration mode. As a result, the waveform W6, which is not similar to the waveform W7 produced at the driving portion 62, is suppressed from being produced. For this reason, the sixth-order vibration mode is suppressed from being produced when the AC voltage corresponding to the seventh-order vibration mode is applied at the driving portion 62. In other words, according to the piezoelectric transformer 10, the sixth-order vibration mode can be suppressed from being excited when an attempt is made to excite the seventh-order vibration mode.

The foregoing can also be said to apply when comparing the seventh-order vibration mode and the eighth-order vibration mode. As described above, according to the piezoelectric transformer 10, the phase of the waveform W7 advances by 180° from segment to segment in the polarized regions, as shown in FIG. 3. Meanwhile, the phase of the waveform W8 advances by about 205° from segment to segment in the polarized regions, as shown in FIG. 6. As a result, a phase difference between the waveform W7 and the waveform W8 increases as the polarized regions progress from the base point, as indicated in FIG. 7. Ultimately, the waveforms W7 and W8 have mutually opposite phases at the end portion of the piezoelectric body 20 on the positive x-axis direction side thereof. Accordingly, in the piezoelectric transformer 10, the waveforms W7 and W8 that are similar at the driving portion 60 are not similar at the driving portion 62, as shown in FIG. 7. Accordingly, the waveform W7 is produced at the driving portion 62 by applying an AC voltage corresponding to the seventh-order vibration mode. As a result, the waveform W8, which is not similar to the waveform W7 produced at the driving portion 62, is suppressed from being produced. For this reason, the eighth-order vibration mode is suppressed from being produced when the AC voltage corresponding to the seventh-order vibration mode is applied at the driving portion 62. In other words, according to the piezoelectric transformer 10, the eighth-order vibration mode can be suppressed from being excited when an attempt is made to excite the seventh-order vibration mode.

As described above, according to the piezoelectric transformer 10, the plurality of driving portions 60 and 62 are provided and disposed symmetrically relative to the plane S1, as shown in FIG. 3; accordingly, similar and unnecessary vibration modes can be suppressed from being produced. In addition, according to the piezoelectric transformer 10, the four polarized regions 21, 22, 26, and 27, which correspond to no less than half of the equally divided seven polarized regions in the piezoelectric body 20, forcefully restrict a stress (displacement) distribution as a result of the driving portions 60 and 62 being configured. Accordingly, the piezoelectric transformer 10 suppresses similar and unnecessary vibration modes from being produced in the driving portions 60 and 62.

Furthermore, the driving portions 60 and 62 are provided at both end portions of the piezoelectric body 20 in the piezoelectric transformer 10, as shown in FIG. 3. As shown in FIG. 4 and FIG. 7, the end portion of the piezoelectric body 20 on the positive side thereof in the x-axis direction corresponds to a position where the waveform of an odd-order vibration mode and the waveform of an even-order vibration mode have opposite phases. Accordingly, even when a high-order vibration mode is excited, the piezoelectric transformer 10 can more effectively suppress the vibration modes of orders before and after the high-order vibration mode from being produced.

The piezoelectric transformer 10 can suppress an odd-order vibration mode different from the seventh-order vibration mode (for example, a fifth-order vibration mode and the ninth-order vibration mode) from being produced. This will be described next using the ninth-order vibration mode as an example.

As shown in FIG. 8, the apex of the antinode in the waveform W7 of the seventh-order vibration mode and the apex of the antinode in a waveform W9 of the ninth-order vibration mode match at both end portions of the piezoelectric transformer 10. In other words, the waveform W7 and the waveform W9 are similar at both end portions of the piezoelectric transformer 10 (that is, at the polarized region 21 and the polarized region 27). However, even if the waveform W7 and the waveform W9 are similar at the polarized region 21, the phase of the waveform W7 and the phase of the waveform W9 shift from each other as the polarized regions progress from segment to segment, and thus the waveform W7 and the waveform W9 are not similar at the polarized region 22. Likewise, even if the waveform W7 and the waveform W9 are similar at the polarized region 27, the phase of the waveform W7 and the phase of the waveform W9 shift from each other as the polarized regions progress from segment to segment, and thus the waveform W7 and the waveform W9 are not similar at the polarized region 26. Accordingly, as shown in FIG. 3, in the piezoelectric transformer 10, the driving portion 60 is configured of the two adjacent polarized regions 21 and 22. Likewise, the driving portion 62 is configured of the two adjacent polarized regions 26 and 27. The waveform W7 is produced at the polarized region 21 in the driving portion 60 and the polarized region 27 in the driving portion 62 by applying an AC voltage corresponding to the seventh-order vibration mode. As a result, the waveform W9, which is not similar to the waveform W7 produced at the polarized region 21 in the driving portion 60 and the polarized region 27 in the driving portion 62, is suppressed from being produced. In other words, in the case where the desired vibration mode is of an odd order, the piezoelectric transformer 10 can suppress a different odd-order vibration mode from being produced. Likewise, in the case where the desired vibration mode is of an even order, a different even-order vibration mode can be suppressed from being produced.

As can be seen in FIG. 1, in the piezoelectric transformer 10, the piezoelectric body 20 has a square cross-sectional shape when viewed as a cross-section parallel to a plane containing the y axis and the z axis. As a result, y-axis direction vibration modes and z-axis direction vibration modes are the same in the piezoelectric body 20. The piezoelectric body 20 therefore reduces the number of vibration modes, as compared to a case where the cross-sectional shape thereof is rectangular. In other words, the piezoelectric transformer 10 further suppresses unnecessary vibration modes from occurring.

As shown in FIG. 3, an electrostatic capacity is formed between the input electrode 30 and the ground electrode 50 in the piezoelectric transformer 10. The plurality of polarized regions 21 and 22 are furthermore present between the input electrode 30 and the ground electrode 50. When a plurality of polarized regions are present between the input electrode 30 and the ground electrode 50, the distance between the input electrode 30 and the ground electrode 50 increases as the number of those polarized regions rises, and as a result, the electrostatic capacity formed between the input electrode 30 and the ground electrode 50 drops. In other words, the piezoelectric transformer 10 handles cases where an extremely low input electrostatic capacity is desired. Note that the same applies to the electrostatic capacity formed between the input electrode 32 and the ground electrode 50.

Furthermore, as shown in FIG. 3, there is an odd number of polarized regions in the piezoelectric transformer 10. Having an odd number of polarized regions results in the polarization directions being symmetrical relative to the plane S1, as shown in FIG. 3. Accordingly, the piezoelectric transformer 10 is not anisotropic depending on a mounting direction. It is thus not necessary to specify the mounting direction when mounting the piezoelectric transformer 10 on a board, and thus identification marks for mounting directions are not necessary.

(First Variation)

Figure 9:
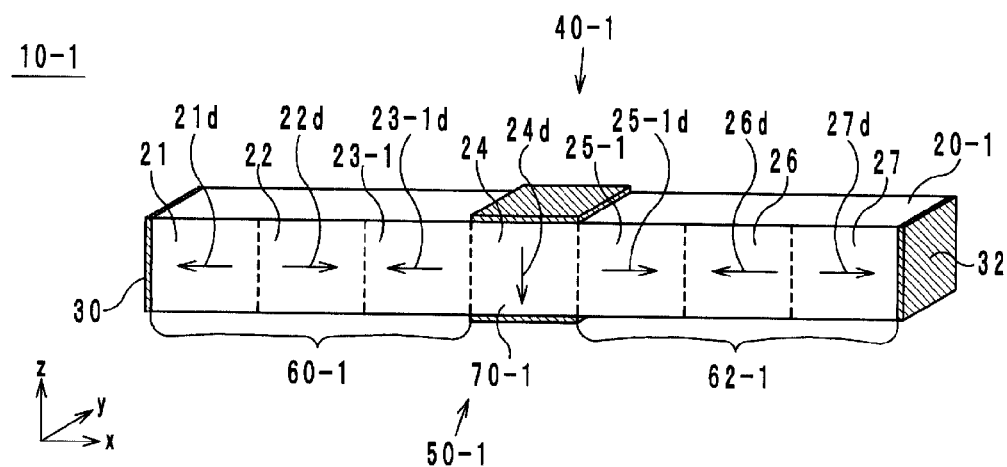
FIG. 9 is an external perspective view of a piezoelectric transformer according to a first variation.

Hereinafter, a piezoelectric transformer 10-1 according to a first variation will be described with reference to the drawings. FIG. 9 is an external perspective view of the piezoelectric transformer 10-1 according to the first variation. The arrows in FIG. 9 indicate the polarization directions.

The piezoelectric transformer 10-1 is different from the piezoelectric transformer 10 in terms of the position and shape of the output electrode 40, the position and shape of the ground electrode 50, and the polarization directions of the polarized regions 23 and 25. The piezoelectric transformer 10-1 is the same as the piezoelectric transformer 10 in other respects, and thus redundant descriptions will be omitted. Note that the output electrode of the piezoelectric transformer 10-1 is referred to as an output electrode 40-1 and the ground electrode of the piezoelectric transformer 10-1 is referred to as a ground electrode 50-1. Furthermore, the polarized regions in the piezoelectric transformer 10-1 that correspond to the polarized regions 23 and 25 will be referred to as polarized regions 23-1 and 25-1. In FIG. 9, elements that are the same as those in the piezoelectric transformer 10 are assigned the same reference signs as in the piezoelectric transformer 10.

The polarized regions 23-1 and 25-1 are polarized in a direction parallel to the x-axis direction, as indicated by the arrows in FIG. 9. Specifically, a polarization direction 23-1*d* of the polarized region 23-1 faces the negative x-axis direction side. Likewise, a polarization direction 25-1*d* of the polarized region 25-1 faces the positive x-axis direction side.

As shown in FIG. 9, the output electrode 40-1 is provided in the polarized region 24. The basic configuration of the inner electrodes and so on in the output electrode 40-1 is the same as in the output electrode 40, and thus descriptions thereof will be omitted here.

As shown in FIG. 9, the ground electrode 50-1 is provided in the polarized region 24. The basic configuration of the inner electrodes and so on in the ground electrode 50-1 is the same as in the ground electrode 50, and thus descriptions thereof will be omitted here.

According to the piezoelectric transformer 10-1 configured as described thus far, the polarized region 24 functions as a power generating portion 70-1. Meanwhile, the polarized regions 21, 22, and 23-1 configure a driving portion 60-1, and the polarized regions 25-1, 26, and 27 configure a driving portion 62-1. In other words, according to the piezoelectric transformer 10-1, a region of a piezoelectric body 20-1 occupied by the driving portions is greater in size than in the piezoelectric body 20 of the piezoelectric transformer 10. The piezoelectric transformer 10-1 can therefore provide a higher coupling coefficient than the piezoelectric transformer 10.

Meanwhile, an electrostatic capacity is formed between the input electrode 30 and the ground electrode 50-1 in the piezoelectric transformer 10-1. Furthermore, as shown in FIG. 9, the three polarized regions 21, 22, and 23-1 are present between the input electrode 30 and the ground electrode 50-1. This number of polarized regions is greater than the number of polarized regions between the input electrode 30 and the ground electrode 50 in the piezoelectric transformer 10. As a result, a distance between the input electrode 30 and the ground electrode 50-1 in the piezoelectric transformer 10-1 is greater than the distance between the input electrode 30 and the ground electrode 50 in the piezoelectric transformer 10. Accordingly, the electrostatic capacity formed between the input electrode 30 and the ground electrode 50-1 in the piezoelectric transformer 10-1 is lower than the electrostatic capacity formed between the input electrode 30 and the ground electrode 50 in the piezoelectric transformer 10. In other words, the piezoelectric transformer 10-1 handles cases where an even lower input electrostatic capacity than the piezoelectric transformer 10 is desired. The same applies to the electrostatic capacity formed between the input electrode 32 and the ground electrode 50-1.

(Second Variation)

Figure 10:
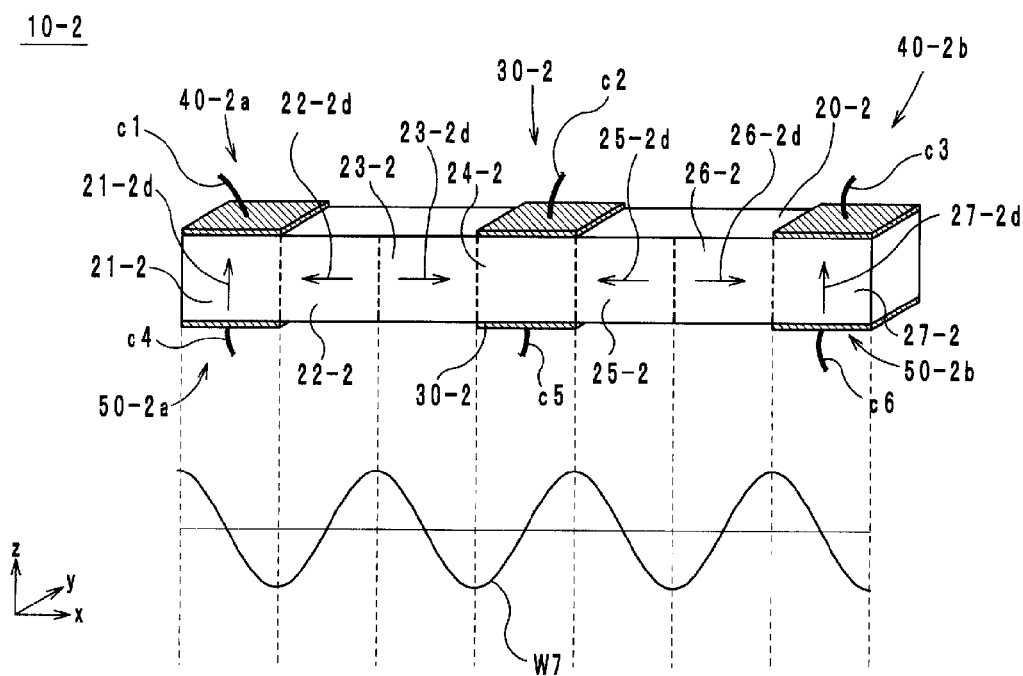
FIG. 10 is an external perspective view of a piezoelectric transformer according to a second variation.

Hereinafter, a piezoelectric transformer 10-2 according to a second variation will be described with reference to the drawings. FIG. 10 is an external perspective view of the piezoelectric transformer 10-2 according to the second variation, and is a diagram that also illustrates polarization directions and displacement at respective areas. The arrows in FIG. 10 indicate the polarization directions. Note that descriptions of configurations in the piezoelectric transformer 10-2 that are the same as those in the piezoelectric transformer 10 will be omitted here.

A piezoelectric body 20-2 in the piezoelectric transformer 10-2 is divided along the x-axis direction into seven equal regions, as shown in FIG. 10. The respective regions of the piezoelectric body 20-2 are indicated as polarized regions 21-2-23-2, a region 24-2, and polarized regions 25-2-27-2, and are arranged in that order from a negative x-axis direction side toward a positive x-axis direction side.

The polarized regions 21-2 and 27-2 are polarized in a direction parallel to the z-axis direction, as indicated by the arrows in FIG. 10. Specifically, a polarization direction 21-2*d* of the polarized region 21-2 and a polarization direction 27-2*d* of the polarized region 27-2 face the positive z-axis direction side.

The polarized regions 22-2, 23-2, 25-2, and 26-2 are polarized in a direction parallel to the x-axis direction, as indicated by the arrows in FIG. 10. The polarization directions of adjacent polarized regions are opposite from each other. Specifically, a polarization direction 22-2*d* of the polarized region 22-2 faces the negative x-axis direction side, and a polarization direction 23-2*d* of the polarized region 23-2 faces the positive x-axis direction side. Furthermore, a polarization direction 25-2*d* of the polarized region 25-2 faces the negative x-axis direction side, and a polarization direction 26-2*d* of the polarized region 26-2 faces the positive x-axis direction side.

Unlike the region 24 in the piezoelectric transformer 10, the region 24-2 is not polarized.

As shown in FIG. 10, an input electrode 30-2 in the piezoelectric transformer 10-2 is a rectangular plate, and is provided so as to cover respective surfaces of the region 24-2 on the positive z-axis direction side and the negative z-axis direction side thereof.

The output electrode in the piezoelectric transformer 10-2 is provided in two locations, in the polarized regions 21-2 and 27-2. The output electrode provided so as to cover the surface of the polarized region 21-2 on the positive z-axis direction side thereof is referred to as an output electrode 40-2*a*, and the output electrode provided so as to cover the surface of the polarized region 27-2 on the positive z-axis direction side thereof is referred to as an output electrode 40-2*b*. The basic configurations of the output outer electrodes, output inner electrodes, and so on in the output electrodes 40-2*a* and 40-2*b* are the same as in the output electrode 40, and thus descriptions thereof will be omitted here.

The ground electrode in the piezoelectric transformer 10-2 is provided in two locations, in the polarized regions 21-2 and 27-2. The ground electrode provided so as to cover the surface of the polarized region 21-2 on the negative z-axis direction side thereof is referred to as a ground electrode 50-2*a*, and the ground electrode provided so as to cover the surface of the polarized region 27-2 on the negative z-axis direction side thereof is referred to as a ground electrode 50-2*b*. The basic configurations of the ground outer electrodes, the ground inner electrodes, and so on in the ground electrodes 50-2*a* and 50-2*b* are the same as in the ground electrode 50, and thus descriptions thereof will be omitted here.

According to the piezoelectric transformer 10-2 configured as described thus far, a segment sandwiched between the input electrode 30-2 and the ground electrode 50-2*a*, or in other words, the polarized regions 22-2 and 23-2, functions as a driving portion. Likewise, a segment sandwiched between the input electrode 30-2 and the ground electrode 50-2*b*, or in other words, the polarized regions 25-2 and 26-2, functions as a driving portion. Furthermore, in the piezoelectric transformer 10-2, the polarized regions 21-2 and 27-2 function as a power generating portion.

As shown in FIG. 10, in the piezoelectric transformer 10-2, the input electrode 30-2, the output electrodes 40-2a and 40-2b, and the ground electrodes 50-2a and 50-2b are provided on respective surfaces of the piezoelectric body 20-2 on the positive z-axis direction side and the negative z-axis direction side thereof. The respective central areas of the input electrode 30-2, the output electrodes 40-2a and 40-2b, and the ground electrodes 50-2a and 50-2b in the x-axis direction are located at nodes of the waveform W7, and thus do not easily vibrate. As shown in FIG. 10, central areas of each electrode in the x-axis direction are bonded to lead lines c1-c6 for connecting to an AC power source, various types of electronic components, and so on; accordingly, the piezoelectric transformer 10-2 can prevent breakage at the locations of the bonds between the lead lines and the corresponding electrodes caused by vibrations produced in the piezoelectric body 20-2.

(Third Variation)

Figure 11:
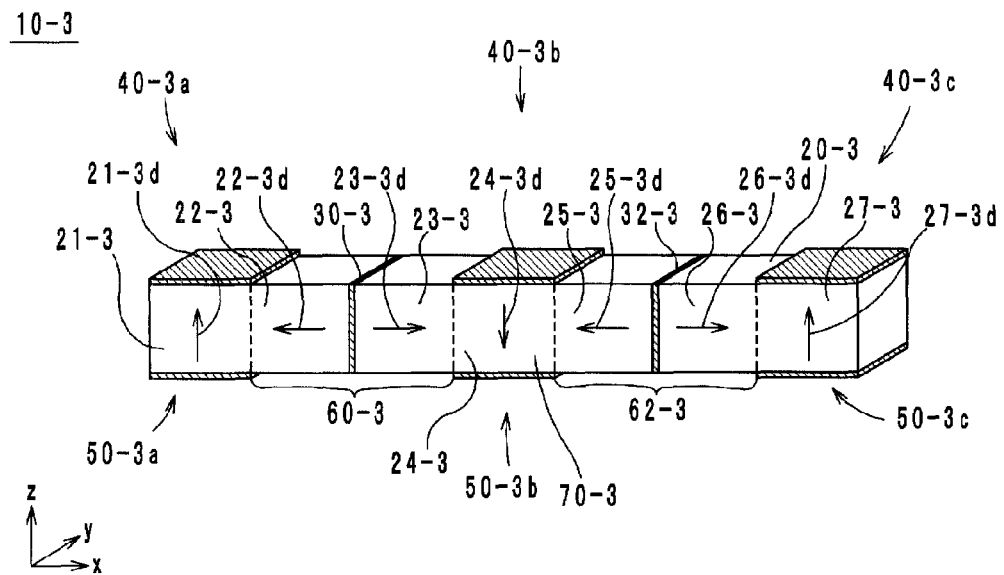
FIG. 11 is an external perspective view of a piezoelectric transformer according to a third variation.
Figure 12:
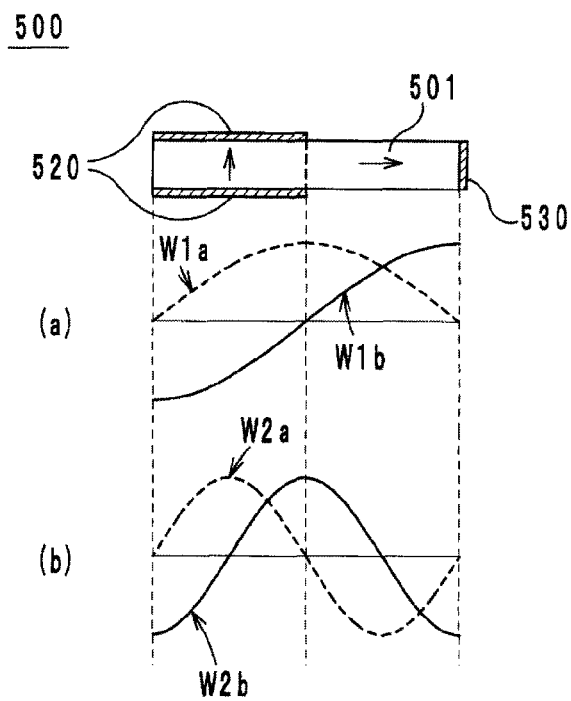
FIG. 12 is a diagram illustrating a side surface of a piezoelectric transformer along with stress and displacement in respective areas of the piezoelectric transformer, according to a comparative example.
Figure 13:
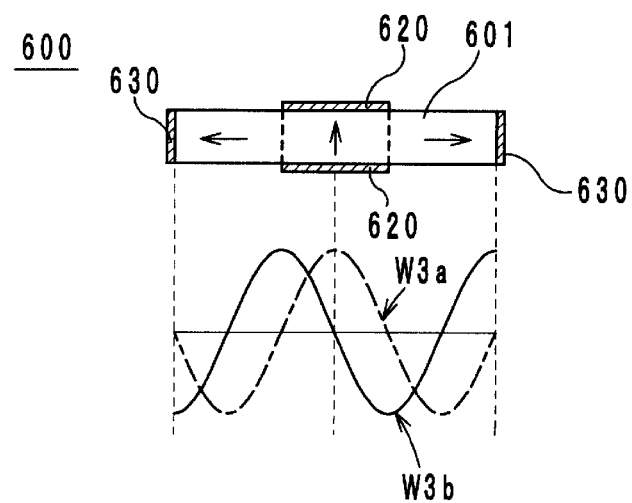
FIG. 13 is a diagram illustrating a side surface of a piezoelectric transformer along with stress and displacement in respective areas of the piezoelectric transformer, according to a comparative example.

Hereinafter, a piezoelectric transformer 10-3 according to a third variation will be described with reference to the drawings. FIG. 11 is an external perspective view of the piezoelectric transformer 10-3 according to the third variation, and is a diagram that also illustrates polarization directions at respective areas. The arrows in FIG. 11 indicate the polarization directions. Note that descriptions of configurations in the piezoelectric transformer 10-3 that are the same as those in the piezoelectric transformer 10 will be omitted here.

A piezoelectric body 20-3 in the piezoelectric transformer 10-3 is divided along the x-axis direction into seven equal polarized regions, as shown in FIG. 11. The polarized regions of the piezoelectric body 20-3 are indicated as polarized regions 21-3-27-3, and are arranged in that order from the negative x-axis direction side toward the positive x-axis direction side.

The polarized regions 21-3, 24-3, and 27-3 are polarized in a direction parallel to the z-axis direction, as indicated by the arrows in FIG. 11. Specifically, a polarization direction 21-3d of the polarized region 21-3 faces the positive z-axis direction side. Likewise, a polarization direction 24-3d of the polarized region 24-3 faces the negative z-axis direction side. Furthermore, a polarization direction 27-3d of the polarized region 27-3 faces the positive z-axis direction side.

The polarized regions 22-3, 23-3, 25-3, and 26-3 are polarized in a direction parallel to the x-axis direction, as indicated by the arrows in FIG. 11. The polarization directions of adjacent polarized regions are opposite from each other. Specifically, a polarization direction 22-3d of the polarized region 22-3 faces the negative x-axis direction side, and a polarization direction 23-3d of the polarized region 23-3 faces the positive x-axis direction side. Furthermore, a polarization direction 25-3d of the polarized region 25-3 faces the negative x-axis direction side, and a polarization direction 26-3d of the polarized region 26-3 faces the positive x-axis direction side.

As shown in FIG. 11, the input electrode in the piezoelectric transformer 10-3 is configured of an input electrode 30-3 provided at a border between the polarized regions 22-3 and 23-3 and an input electrode 32-3 provided at a border between the polarized regions 25-3 and 26-3. The input electrodes 30-3 and 32-3 are square plates that are parallel to a plane orthogonal to the x-axis direction.

As shown in FIG. 11, the output electrode in the piezoelectric transformer 10-3 is provided in the polarized regions 21-3, 24-3, and 27-3. The output electrode provided so as to cover the surface of the polarized region 21-3 on the positive z-axis direction side thereof is referred to as an output electrode 40-3a, and the output electrode provided so as to cover the surface of the polarized region 24-3 on the positive z-axis direction side thereof is referred to as an output electrode 40-3b. Furthermore, the output electrode provided so as to cover the surface of the polarized region 27-3 on the positive z-axis direction side thereof is referred to as an output electrode 40-3c. The basic configurations of the output outer electrodes, output inner electrodes, and so on in the output electrodes 40-3a, 40-3b, and 40-3c are the same as in the output electrode 40, and thus descriptions thereof will be omitted here.

As shown in FIG. 11, a ground electrode 50-3 is provided in the polarized regions 21-3, 24-3, and 27-3. The ground electrode provided so as to cover the surface of the polarized region 21-3 on the negative z-axis direction side thereof is referred to as a ground electrode 50-3a, and the ground electrode provided so as to cover the surface of the polarized region 24-3 on the negative z-axis direction side thereof is referred to as a ground electrode 50-3b. Furthermore, the ground electrode provided so as to cover the surface of the polarized region 27-3 on the negative z-axis direction side thereof is referred to as a ground electrode 50-3c. The basic configurations of the ground outer electrodes, the ground inner electrodes, and so on in the ground electrodes 50-3a, 50-3b, and 50-3c are the same as in the ground electrode 50, and thus descriptions thereof will be omitted here.

Here, in the piezoelectric transformer 10-3, the polarized regions 22-3 and 23-3 configure a driving portion 60-3, and the polarized regions 25-3 and 26-3 configure a driving portion 62-3. Furthermore, the polarized regions 21-3, 24-3, and 27-3 configure a power generating portion 70-3.

The piezoelectric transformer 10-3 configured as described thus far can achieve a larger input electrostatic capacity than the piezoelectric transformer 10 for the reasons described hereinafter.

An electrostatic capacity is formed between the input electrode 30-3 and the ground electrode 50-3a in the piezoelectric transformer 10-3. A distance between the input electrode 30-3 and the ground electrode 50-3a is half the distance between the input electrode 30 and the ground electrode 50 in the piezoelectric transformer 10. In other words, the electrostatic capacity formed between the input electrode 30-3 and the ground electrode 50-3a is double the electrostatic capacity formed between the input electrode 30 and the ground electrode 50 in the piezoelectric transformer 10. Furthermore, an electrostatic capacity is formed between the input electrode 30-3 and the ground electrode 50-3b in the piezoelectric transformer 10-3. A distance between the input electrode 30-3 and the ground electrode 50-3b is half the distance between the input electrode 30 and the ground electrode 50 in the piezoelectric transformer 10. In other words, the electrostatic capacity formed between the input electrode 30-3 and the ground electrode 50-3b is double the electrostatic capacity formed between the input electrode 30 and the ground electrode 50 in the piezoelectric transformer 10.

Accordingly, the electrostatic capacity produced in the driving portion 60-3 of the piezoelectric transformer 10-3 is quadruple the electrostatic capacity in the driving portion 60 of the piezoelectric transformer 10. The same applies to the electrostatic capacity produced in the driving portion 62-3. The piezoelectric transformer 10-3 can therefore provide a higher input electrostatic capacity than the piezoelectric transformer 10.

Other Embodiments

The piezoelectric transformer according to the present invention is not limited to the piezoelectric transformer 10 and the piezoelectric transformers 10-1, 10-2, and 10-3 that are variations thereon, and many modifications can be made without departing from the essential scope of the present invention. For example, the piezoelectric transformer 10 may be used as a step-up transformer by switching the input electrodes and the output electrodes in the piezoelectric transformer 10. The piezoelectric transformer may also handle vibrations of a higher order than the seventh-order vibration mode. Furthermore, the direction in which the piezoelectric body 20 is layered may be parallel to the x-axis direction, the y-axis direction, or the like.

As described thus far, the present invention is useful for a piezoelectric transformer used in contactless power transmission and the like, and is particularly useful in terms of making it possible to suppress unnecessary vibration modes from being produced.

REFERENCE SIGNS LIST 10, 10-1, 10-2, 10-3 piezoelectric transformer
20, 20-1, 20-2, 20-3 piezoelectric body
21-27, 23-1, 25-1, 21-2-23-2, 25-2-27-2, 21-3-27-3 polarized region
30, 32, 30-2, 30-3, 32-3 input electrode
40, 40-1, 40-2a, 40-2b, 40-3a, 40-3b, 40-3c output electrode
60, 60-1, 60-3, 62, 62-1, 62-3 driving portion
70, 70-1, 70-3 power generating portion

The invention claimed is:

1. A piezoelectric transformer comprising:
a piezoelectric body having a plurality of polarized regions arranged in a lengthwise direction of the piezoelectric body, the length of each of the polarized regions in the lengthwise direction being equal, a first subset of at least two of the plurality of polarized regions defining a first driving portion, a second subset of at least two of the plurality of regions defining a second driving portion and a third subset of the plurality of polarized regions defining a power generation portion;
an input electrode constructed to apply a voltage to the first and second driving portions; and
an output electrode constructed to output a voltage generated by the power generating portion;
the first and second driving portions being disposed symmetrically relative to a plane that passes through a center of the piezoelectric body in the lengthwise direction and orthogonal to the lengthwise direction, and the plurality of polarized regions defining the first and second driving portions being no less than half of the plurality of polarized regions of the piezoelectric body.

2. The piezoelectric transformer according to claim 1, wherein each of the polarized regions of the first and second driving portions are polarized in the lengthwise direction.

3. The piezoelectric transformer according to claim 2, wherein at least two adjacent polarized regions of at least one of the first and second driving portions are polarized in opposite directions.

4. The piezoelectric transformer according to claim 1, wherein two adjacent polarized regions of at least one of the first and second driving portions are polarized in opposite directions.

5. The piezoelectric transformer according to claim 1, wherein the third subset of polarized regions comprises at least two polarized regions and each of the polarized regions of the power generation portion are polarized in a direction which is orthogonal to the lengthwise direction.

6. The piezoelectric transformer according to claim 5, wherein each adjacent polarized region of the power generating portion is polarized in a direction opposite its adjacent polarized region of the power generating portion.

7. The piezoelectric transformer according to claim 1, wherein the third subset of polarized regions comprises at least two polarized regions and each adjacent polarized region of the power generating portion is polarized in a direction opposite to its adjacent polarized region of the power generating portion.

8. The piezoelectric transformer according to claim 1, further comprising:
a ground electrode arranged such that a plurality of polarized regions are between the input electrode and the ground electrode.

9. The piezoelectric transformer according to claim 1, wherein a cross-section of the piezoelectric body taken along a direction orthogonal to the lengthwise direction of the piezoelectric body has a square shape.

10. The piezoelectric transformer according to claim 1, wherein a number of the plurality of polarized regions is an odd number.

11. The piezoelectric transformer according to claim 1, wherein the input electrode comprises opposed input electrodes provided on respective opposed end surfaces of the piezoelectric body in the lengthwise direction.

12. The piezoelectric transformer according to claim 8, wherein the input electrode comprises opposed input electrodes provided on respective opposed end surfaces of the piezoelectric body in the lengthwise direction.

13. The piezoelectric transformer according to claim 12, wherein a first distance between each opposed input electrode and the ground electrode is greater than a second distance between the output electrode and the ground electrode.

14. The piezoelectric transformer according to claim 1, wherein the input electrode is provided in a central area of the piezoelectric body in the lengthwise direction thereof.

15. The piezoelectric transformer according to claim 1, further comprising a non-polarized region in a central area of the piezoelectric body in the lengthwise direction thereof, and
wherein the input electrode is provided in the non-polarized region.

16. The piezoelectric transformer according to claim 1, wherein the input electrode comprises opposed input electrodes provided at a border between adjacent polarized regions in each of the plurality of driving portions.

17. The piezoelectric transformer according to claim 1, wherein the plurality of polarized regions is seven and the phase of the seventh order vibration mode waveform advances by 180 degrees as it advances from one adjacent polarized region to the next.

* * * * *